United States Patent
Muchherla et al.

(10) Patent No.: US 12,131,060 B2
(45) Date of Patent: Oct. 29, 2024

(54) QUICK CHARGE LOSS MITIGATION USING TWO-PASS CONTROLLED DELAY

(71) Applicant: Micron Technology, Inc., Boise, ID (US)

(72) Inventors: Kishore Kumar Muchherla, Fremont, CA (US); Dung V. Nguyen, San Jose, CA (US); Dave Scott Ebsen, Minnetonka, MN (US); Tomoharu Tanaka, Kanagawa (JP); James Fitzpatrick, Laguna Niguel, CA (US); Huai-Yuan Tseng, San Ramon, CA (US); Akira Goda, Tokyo (JP); Eric N. Lee, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 67 days.

(21) Appl. No.: 17/872,426

(22) Filed: Jul. 25, 2022

(65) Prior Publication Data
US 2024/0028252 A1  Jan. 25, 2024

(51) Int. Cl.
G06F 3/06  (2006.01)
(52) U.S. Cl.
CPC .......... *G06F 3/0655* (2013.01); *G06F 3/0604* (2013.01); *G06F 3/064* (2013.01); *G06F 3/0679* (2013.01)
(58) Field of Classification Search
None
See application file for complete search history.

(56) References Cited

U.S. PATENT DOCUMENTS

| | | | | |
|---|---|---|---|---|
| 8,458,416 B2 * | 6/2013 | Warren | ............... | G11C 11/5621 711/134 |
| 8,954,708 B2 * | 2/2015 | Kim | ............... | G06F 12/0246 711/202 |

(Continued)

FOREIGN PATENT DOCUMENTS

| WO | 2016118225 A1 | 7/2016 |
|---|---|---|
| WO | 2018/187016 A1 | 10/2018 |

(Continued)

OTHER PUBLICATIONS

Li, Y., et al., "A Novel quasi-SLC(qSLC) Program/Erase Scheme in Ultra-Densified Charge-trapping 3D NAND Flash Memory to Enhance System Level Performance", IEEE Silicon Nanoelectronics Workshop (SNW), Jun. 13-14, 2020, 2 pages.

(Continued)

*Primary Examiner* — Elias Mamo
(74) *Attorney, Agent, or Firm* — NICHOLSON DE VOS WEBSTER & ELLIOTT LLP

(57) ABSTRACT

Exemplary methods, apparatuses, and systems include a quick charge loss (QCL) mitigation manager for controlling writing data bits to a memory device. The QCL mitigation manager receives a first set of data bits for programming to memory. The QCL mitigation manager writes a first subset of data bits of the first set of data bits to a first memory block of the memory during a first pass of programming. The QCL mitigation manager writes a second subset of data bits of the first set of data bits to the first memory block during a second pass of programming in response to determining that the threshold delay is satisfied.

20 Claims, 5 Drawing Sheets

(56) References Cited

U.S. PATENT DOCUMENTS

| | | | |
|---|---|---|---|
| 10,109,361 B1 * | 10/2018 | Khakifirooz | G11C 16/3481 |
| 10,373,697 B1 | 8/2019 | Lai et al. | |
| 11,556,479 B1 | 1/2023 | He et al. | |
| 2010/0110798 A1 * | 5/2010 | Hoei | G11C 16/26 365/185.24 |
| 2019/0272872 A1 * | 9/2019 | Moschiano | G11C 16/0483 |
| 2020/0319808 A1 * | 10/2020 | Wang | G06N 3/084 |
| 2020/0395087 A1 | 12/2020 | Banerjee et al. | |
| 2021/0279180 A1 | 9/2021 | Um | |
| 2021/0349662 A1 * | 11/2021 | Helm | G06F 3/0659 |
| 2022/0050627 A1 | 2/2022 | Pratt | |
| 2022/0336028 A1 | 10/2022 | Moschiano et al. | |
| 2022/0343983 A1 | 10/2022 | Shin et al. | |
| 2023/0027384 A1 | 1/2023 | Tseng et al. | |
| 2023/0034752 A1 | 2/2023 | Ning et al. | |

FOREIGN PATENT DOCUMENTS

| | | |
|---|---|---|
| WO | 2019221790 A1 | 11/2019 |
| WO | 2022/039940 A1 | 2/2022 |

OTHER PUBLICATIONS

Lin, H., et al., "Optimal Read Voltages of Retention-after-Cycling in Triple-level-cell (TLC) 3D NAND Flash Memory and its High-precision Modeling Method", IEEE Silicon Nanoelectronics Workshop (SNW), Jun. 11-12, 2022, 2 pages.

Mielke, N. R., et al., "Reliability of Solid-State Drives Based on NAND Flash Memory", Proceedings of the IEEE, vol. 105, No. 9, Sep. 2017, pp. 1725-1750.

Ye et al., "Valid Window: A New Metric to Measure the Reliability of NAND Flash Memory," 2020 Design, Automation & Test in Europe Conference & Exhibition, Grenoble, France, 2020, pp. 109-114.

Sakui et al., "NAND Flash Memory Technology," in Nonvolatile Memory Technologies with Emphasis on Flash: A V Comprehensive Guide to Understanding and Using Flash Memory Devices, IEEE, 2008, pp. 223-311.

* cited by examiner

QUICK CHARGE LOSS MITIGATION USING TWO-PASS CONTROLLED DELAY

CROSS-REFERENCE TO RELATED APPLICATION

This present application is related to U.S. application Ser. No. 17/872,217, filed Jul. 25, 2022 and entitled "MEMORY DEVICE PROGRAMMING TECHNIQUE FOR INCREASED BITS PER CELL" which is incorporated herein by reference in its entirety.

TECHNICAL FIELD

The present disclosure generally relates to corrective programming of memory devices, and more specifically, relates to two-pass corrective programming of memory cells that each store multiple bits and quick charge loss mitigation for two-pass corrective programming.

BACKGROUND ART

A memory subsystem can include one or more memory devices that store data. The memory devices can be, for example, volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
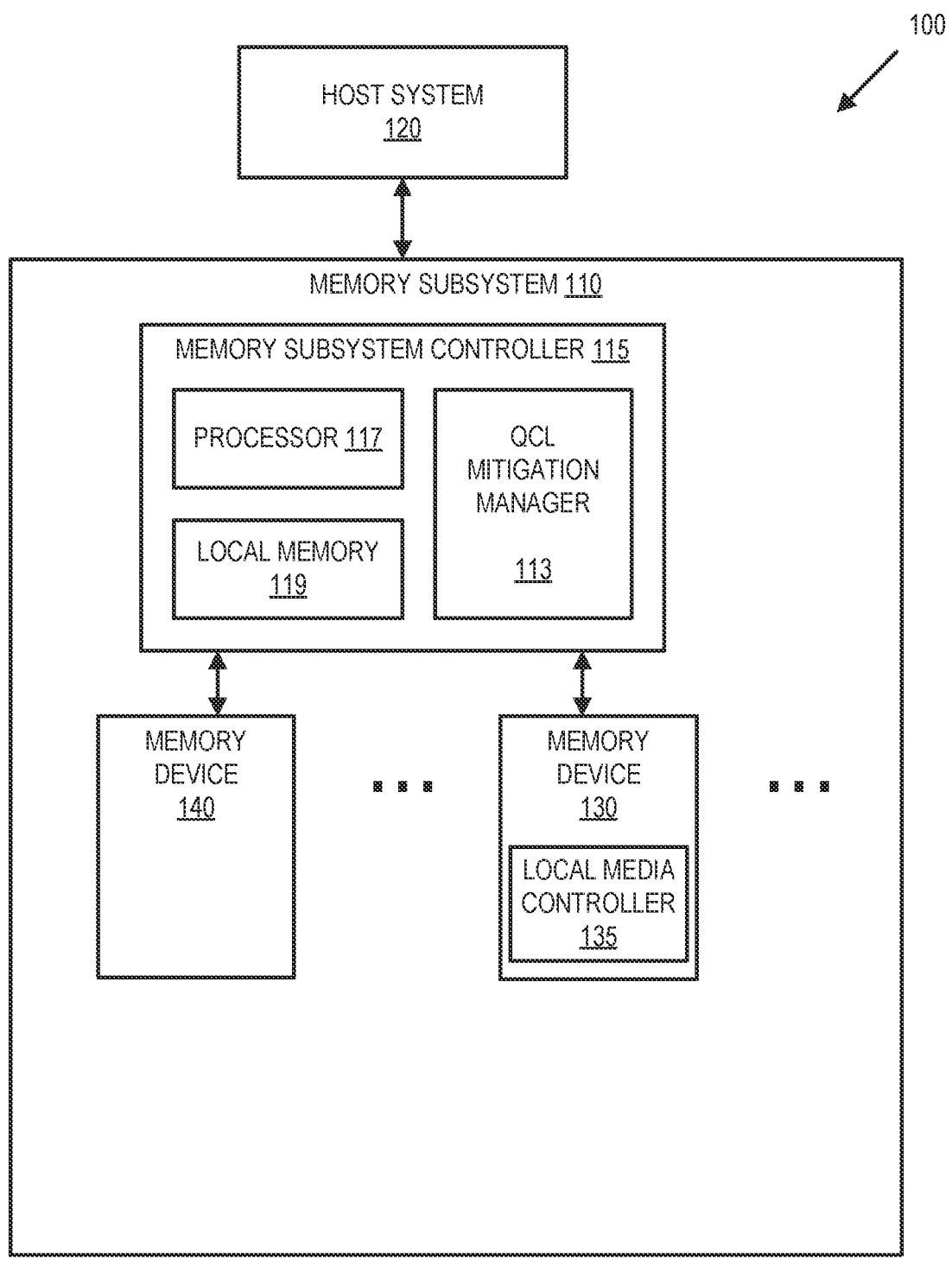
FIG. 1 illustrates an example computing system that includes a memory subsystem in accordance with some embodiments of the present disclosure.

Aspects of the present disclosure are directed to quick charge loss mitigation using two-pass corrective programming and controlled delay in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Using QLCs often results in large buffer requirements to prevent loss of data bits during two-pass programming. In 16-16 two-pass programming, for example, the first pass includes coarse data programming and the second pass includes fine data programming. Coarse data programming programs QLCs to 16 threshold voltage (Vt) states (representing the 16 different combinations of values for 4 bits) but leaves the data in an unreadable state. Programming the QLCs using 16 threshold voltage (Vt) states reduces the number of additional electrons to program the QLCs to the readable state during the second pass. To prevent data loss and otherwise provide access to the data, the corresponding data is also stored in a buffer until the second pass of fine data programming is complete, which leaves the data in a readable 16 Vt state. This buffering of data requires memory cells in addition to the storage space available to host systems (i.e., an overprovisioning penalty).

Additionally, after performing a first pass of programming, the memory blocks experience quick charge loss (QCL). QCL is the result of electrons trapped in the tunnel oxide layer after the programming pulse moving back into the channel region. During a second pass of programming, the memory subsystem can compensate for this loss of electrical charge. If the electrical charge loss has not stabilized in the memory block at the time of the second pass, however, the programming voltages can fail to correctly compensate for QCL or the charge loss may continue after the second pass of programming.

Aspects of the present disclosure address the above and other deficiencies by programming a subset of the data in a readable 8 Vt state in the first pass, buffering only the remainder of data (i.e., a 75% reduction in buffer space for programming a given subdivision of memory), and programming the remainder of data in the second pass of programming, increasing the programmed memory to a greater bit density for a readable 16 Vt state. This "8-16" two-pass programming, however, increases the QCL stress on the first pass of programming. QCL is characterized by a time decay and a reduction of the threshold voltage of a cell until reaching a steady state value. As such, aspects of the present disclosure use a controlled delay between passes of two-pass programming to mitigate QCL. A delay between programming passes based on the time decay enables the second pass of programming to occur after the threshold voltage of the cell has achieved a steady state value. The memory subsystem adjusts the second pass of programming to write the memory cells to a readable 16 threshold voltage state and compensate for the quick charge loss steady state. Additionally, the memory subsystem can reduce buffering between a first and second pass when a host write speed is such that the first pass of programming is longer than the threshold delay.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory devices 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a QCL mitigation manager 113 that controls the timing of two-pass programming. In some embodiments, the controller 115 includes at least a portion of the QCL mitigation manager 113. For example, the controller 115 can include a processor 117 (processing device) configured to execute instructions stored in local memory 119 for performing the operations described herein. In some embodiments, a QCL mitigation manager 113 is part of the host system 120, an application, or an operating system.

The QCL mitigation manager 113 controls how received data bits are written to the memory devices in multiple pass programming. In doing so, the QCL mitigation manager 113 mitigates electrical charge loss after a second pass of programming. For instance, the programming manager tracks a time interval to manage a delay between a first pass of programming and a second pass of programming. In one embodiment, the QCL mitigation manager 113 uses an amount of time based on a predetermined electrical charge loss time decay for the memory device 130 as the threshold delay. In other embodiments, the QCL mitigation manager 113 uses a number of computing operations after the first pass of programming as the threshold delay. Further details with regards to the operations of the QCL mitigation manager 113 are described below.

Figure 2:
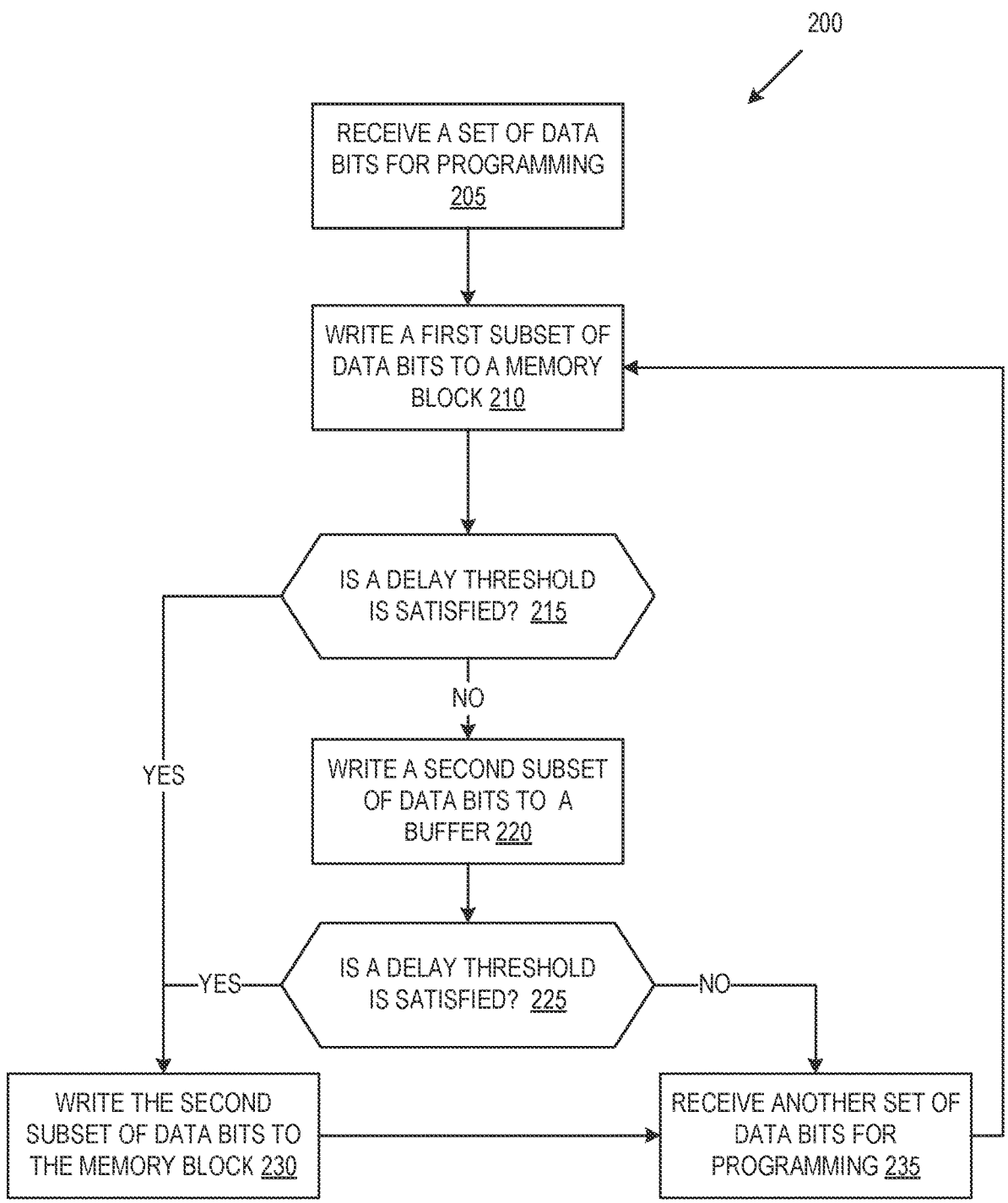
FIG. 2 is a flow diagram of an example method of quick charge loss mitigation using two-pass corrective programming and controlled delay in accordance with some embodiments of the present disclosure.

FIG. 2 is a flow diagram of an example method of quick charge loss mitigation using two-pass corrective programming and controlled delay in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the QCL mitigation manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the QCL mitigation manager 113 receives a first set of data bits for programming to the memory devices. For example, the QCL mitigation manager 113 can receive a data stream from the host system 120, the data stream including multiple sets of data bits. In some embodiments, the QCL mitigation manager 113 receives at least one block of data bits for programming to blocks of the memory devices. Examples set forth herein refer to memory blocks, but other subdivisions of memory and other sets/groupings of data can be used.

At operation 210, in response to determining that the current programming pass is a first pass of programming, the QCL mitigation manager 113 writes a first subset of data bits to a memory block. For example, the QCL mitigation manager 113 selects the first subset of data bits from the first set of data bits. In some embodiments, the QCL mitigation manager 113 selects 75% of the first set of data bits as the first subset of data bits for programming during the first pass of programming. For example, the QCL mitigation manager 113 can initially program the memory block in a readable, 8 Vt state. In another embodiment, the QCL mitigation manager 113 selects 50% of the first set of data bits and writes them to memory. For instance, the QCL mitigation manager 113 can use 4-16 two pass programming and, e.g., write 2 pages of data bits to the memory block in a readable 4 Vt state in the first pass and the remaining pages can be written to a buffer/programmed to a 16 Vt state in the second pass.

At operation 215, in response to completing the first pass of programming, the QCL mitigation manager 113 determines if a delay threshold is satisfied. For example, the delay threshold is set based on the predetermined physical attributes of the memory device 130 and the associated time decay of the electrical charge loss of the memory device 130. In some embodiments, the delay threshold is a time interval in which the electrical charge loss of the memory is a steady state value (e.g., 10 seconds). As such, the QCL mitigation manager 113 determines the delay threshold is satisfied by tracking an amount of time elapsed after initiating the first pass of programming. For example, the QCL mitigation manager 113 determines difference between a time of writing the first subset of data bits to a first wordline (e.g., a start time or writing a first bit) and the later of a current time and of writing the first subset of data bits to a last wordline (e.g., a stop time or writing a last bit).

In other embodiments, the QCL mitigation manager 113 determines that the threshold delay is satisfied by determining a number of computing operations that have been completed after writing a first subset of data bits of the first set to a first memory block. For example, the QCL mitigation manager 113 can use an operation counter and compare the number of computing operations that have been completed with a threshold number of computing operations. In one embodiment, the threshold delay is satisfied after completing a first pass of programming of seven blocks of memory (including the block/set of data bits).

If the QCL mitigation manager 113 determines the delay threshold is not satisfied, the method 200 proceeds to operation 220. If the QCL mitigation manager 113 determines the delay threshold is satisfied, the method 200 proceeds to operation 230.

At operation 220, the QCL mitigation manager 113 writes a second subset of data bits to a buffer. Continuing with the example from operation 210, the QCL mitigation manager 113 writes the remaining 25% of the first set of data bits to a buffer. The remaining 25% of the first set of data bits are accessible from the buffer in the event recovery or a read is necessary prior to writing the remaining 25% to the memory block. In an embodiment the QCL mitigation manager 113 writes a first subset of data bits including 50% of the first set of data bits to the memory block at operation 210, the QCL mitigation manager 113 writes a remaining 50% of the first set of data bits to the buffer during operation 220. The buffer can be a NAND latch, an SLC block, or volatile memory. In one embodiment, the buffer is a "first-in, first out" (FIFO) buffer configured to temporarily store subsets of data for up to a threshold number of operations. For example, if the threshold delay is satisfied after completing a first pass of programming of seven blocks of memory, a FIFO buffer can be configured to six or seven subsets of data (e.g., the remaining 25% of six/seven blocks).

At operation 225, the QCL mitigation manager 113 determines if the delay threshold is satisfied. Similar to as described above with regard to operation 215, the QCL mitigation manager 113 compares the time interval between the first pass of programming of a first wordline of the memory block to the current system time (e.g., a time difference) or compares a number of computing operations or compares a number of blocks programmed to respective threshold delays. After writing the second subset of data bits to the buffer, the current system time will be a time occurring after the current system time at operation 215. If the delay threshold is satisfied, the method 200 proceeds to operation 230. If the delay threshold is not satisfied, the method 200 proceeds to operation 235.

At operation 230, the QCL mitigation manager 113 writes the second subset of data bits to the memory block in response to determining the delay threshold has been satisfied. Continuing with the previous example where the QCL mitigation manager 113 writes 75% of the first set of data bits to the memory block at operation 210, the QCL mitigation manager 113 writes the remaining 25% of the first set of data bits to the memory block during a second pass of programming. The second pass of programming increases the bit density of the cells of the memory block. Because the electrical charge loss is at a steady state value, the QCL mitigation manager 113 programs the cell to the final threshold voltage thereby compensating the electrical charge loss. Since fewer electrons are used to program the second pass fine state, the QCL on top of 2nd pass programming is mitigated.

At operation 235, the QCL mitigation manager 113 receives another set of data bits for programming to memory. Similar to the description of operation 205 above, the QCL mitigation manager 113 can receive an additional block of data bits for programming to blocks and the method 200 returns to operation 210.

In some embodiments, when the method 200 returns to operation 210, the QCL mitigation manager 113 writes another subset of data bits from the set of data bits received at operation 235 to a second memory block. After writing the subset of data bits, the method 200 proceeds to operation 215 and tests the delay threshold for any previous block that has received a first pass of programming but not a second pass of programming.

When a block satisfies the delay threshold (at operation 215 or operation 225), the method 200 proceeds to operation 230 to perform the second pass of programming for that block (i.e., writing the second subset of data bits to the memory block). For any blocks that do not satisfy the delay threshold, the method 200 proceeds to operations 220 and 235 as described above.

In some embodiments, when the delay threshold for the first set of data bits is satisfied after the second subset of data bits is written to a buffer the QCL mitigation manager 113 can perform a write of the second subset of data bits to memory. Until the delay threshold is satisfied, the QCL mitigation manager 113 may receive additional sets of data bits for programming and perform operations 210, 215, 220, 225, 230, and 235, in an iterative manner.

Figure 3:
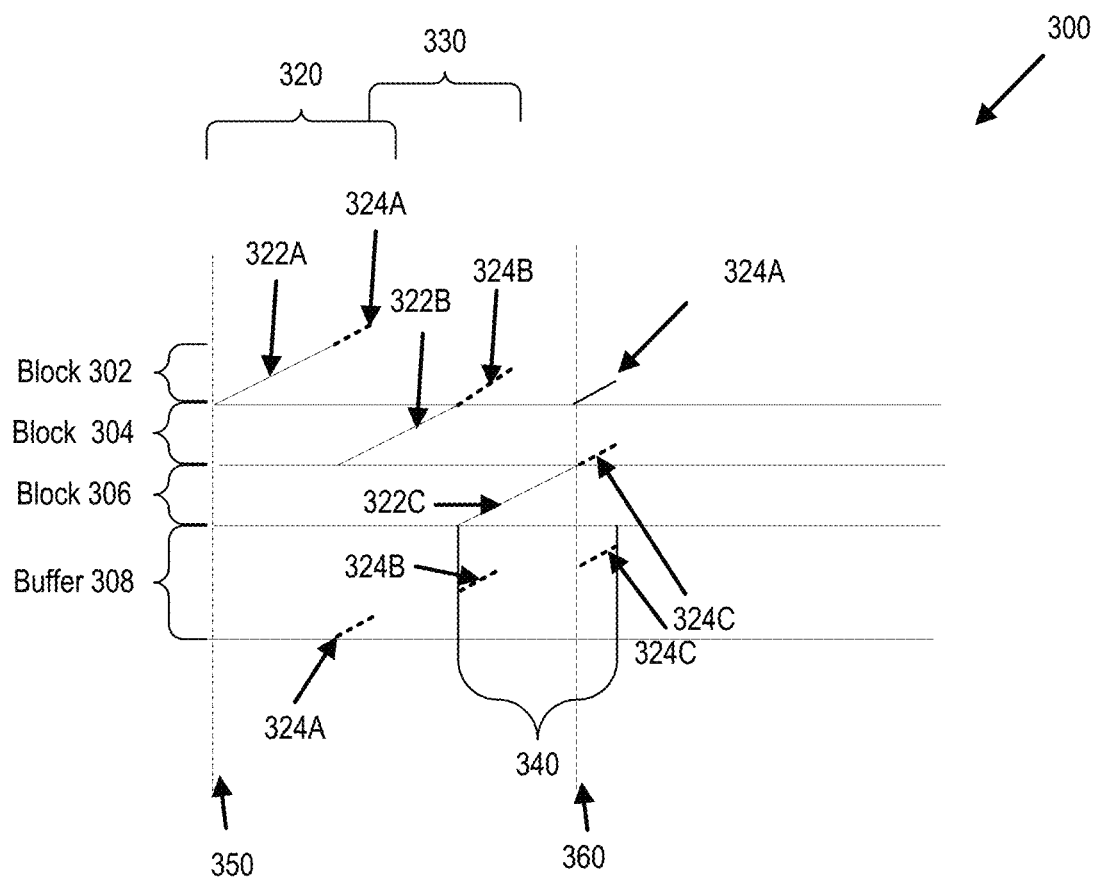
FIG. 3 is an example of a timing diagram for two-pass corrective programming and controlled delay in accordance with some embodiments of the present disclosure.

FIG. 3 is an example of a timing diagram for two-pass corrective programming and controlled delay in accordance with some embodiments of the present disclosure. For instance, the timing diagram illustrates a two-pass programming to multiple blocks. A first timing line 350 indicates a start time of the first pass of programming for memory block 302. A second timing line 360 indicates a subsequent time that satisfies the threshold delay as measured from the first timing line 350.

The timing diagram 300 includes memory blocks 302, 304, and 306 (collectively "memory blocks 302-306"). In the example depicted by FIG. 3, a series of lines represent writing of data bits to locations in the corresponding block. For example, the QCL mitigation manager 113 writing a first set of data bits 320 to memory block 302 is represented by a line including a line segment representing writing a first subset of data bits 322A (e.g., 75% of the first set of data bits 320) and another line segment representing writing a second subset of data bits 324A (e.g., the remaining 25% of the first set of data bits 320). The QCL mitigation manager 113 determines at completion of writing the first subset of data bits 322A that the threshold delay is not satisfied (as indicated in FIG. 3 by positions in time to the left of second timing line 360). The QCL mitigation manager 113 writes the second subset of data bits 324A to a buffer location 308 as depicted by the dashed line 324A representing the writing the second subset of data bits to the buffer location 308.

The QCL mitigation manager 113 proceeds to writing a first pass of a second set of data bits 330 that includes a third subset of data bits 322B and a fourth subset of data bits 324B to memory block 304 (e.g., 75% of the second set of data bits 330 and the remaining 25% of the second set of data bits 330, respectively). After performing a first pass of programming on the third subset of data bits 322B, the QCL mitigation manager 113 writes the fourth subset of data bits 324B to the buffer location 308 (as shown by the dashed lined 324B) as the threshold delay for the second set of data bits (not shown) is not satisfied. While any number of subsets can be written to the buffer location, the number will depend on a length of time associated with the threshold delay and the write speed of the host. For a host writing under normal speeds, the second subset 324A and the fourth subset of data 324B are generally written to the buffer location 308.

Once again, the QCL mitigation manager 113 determines that the threshold delay is not satisfied (as indicated in FIG. 3 by positions in time to the left of second timing line 360). The QCL mitigation manager 113 proceeds to write a third set of data bits 340 to memory block 306. Similar to the description above, the QCL mitigation manager writes a subset of data bits 322C of the third set of data bits 340 to memory block 306. At the completion of writing the subset of data bits 322C, the QCL mitigation manager 113 determines that the threshold delay for the first set of data bits 320 has been satisfied. In response to determining that the threshold delay for the first set of data bits 320 has been satisfied, the QCL mitigation manager 113 writes the second subset of data bits 324A to memory block 302 (i.e., programming memory block 302 to a readable 16 Vt state). Concurrently, the QCL mitigation manager 113 writes the remaining subset of data bits 324C of the third set of data bits 340 to the buffer.

While only three memory blocks 302-306 are shown, any number of memory blocks and corresponding delay thresholds can be implemented. For instance, the delay threshold can be determined using a number of computing operations after writing the first set of data bits 320 to the memory block 302. In some embodiments, a QCL mitigation manager 113 may receive requests from hosts to write at various speeds. In one example, the QCL mitigation manager 113 receives requests from hosts at a speed that results in the threshold delay being satisfied before completion of the write of the first subset of data bits 322A to memory block 302. In this example, the QCL mitigation manager 113 does not buffer the second subset of data bits 324A but instead commences the second pass of programming following completion of the first subset of data bits 322A.

Figure 4:
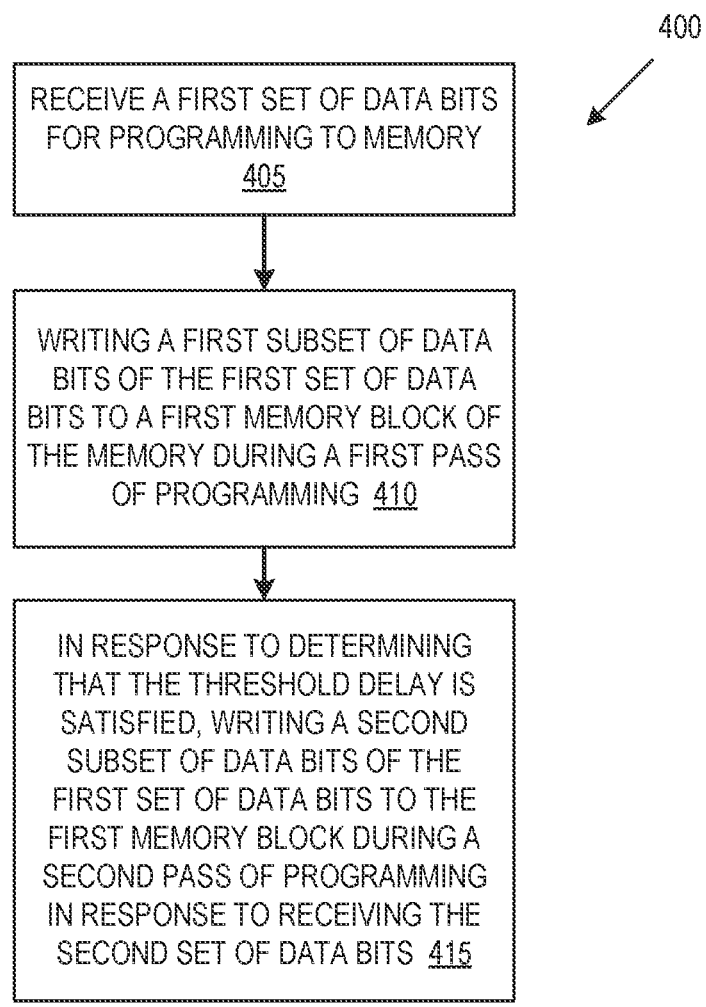
FIG. 4 is a flow diagram of an example method of two-pass corrective programming and controlled delay in accordance with some embodiments of the present disclosure.

FIG. 4 is a flow diagram of an example method of two-pass corrective programming and controlled delay in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the QCL mitigation manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the QCL mitigation manager 113 receives a first set of data bits for programming to memory. As described with regard to operation 205 above, the QCL mitigation manager 113 is configured to receive sets of data bits for programming to the memory devices. For example, the QCL mitigation manager 113 can receive a data stream from the host system 120, the data stream including multiple blocks include at least a first set of data bits.

At operation 410, the QCL mitigation manager 113 writes the first subset of data bits of the first set of data bits to a first memory block of the memory during a first pass of programming. As described above with regard to operation 215, the QCL mitigation manager 113 determines that the set of data bits is being received for a first programming pass and performs a write including the first subset of data bits.

At operation 415, the QCL mitigation manager 113 writes a second subset of data bits of the first set of data bits to the first memory block during a second pass of programming in response to receiving the second set of data bits in response to determining that the threshold delay is satisfied. As described with regard to operation 235, the QCL mitigation manager 113 writes the remainder of the first set of data bits (e.g., all data bits of the first set of data bits except the first subset of data bits) to the memory block.

Figure 5:
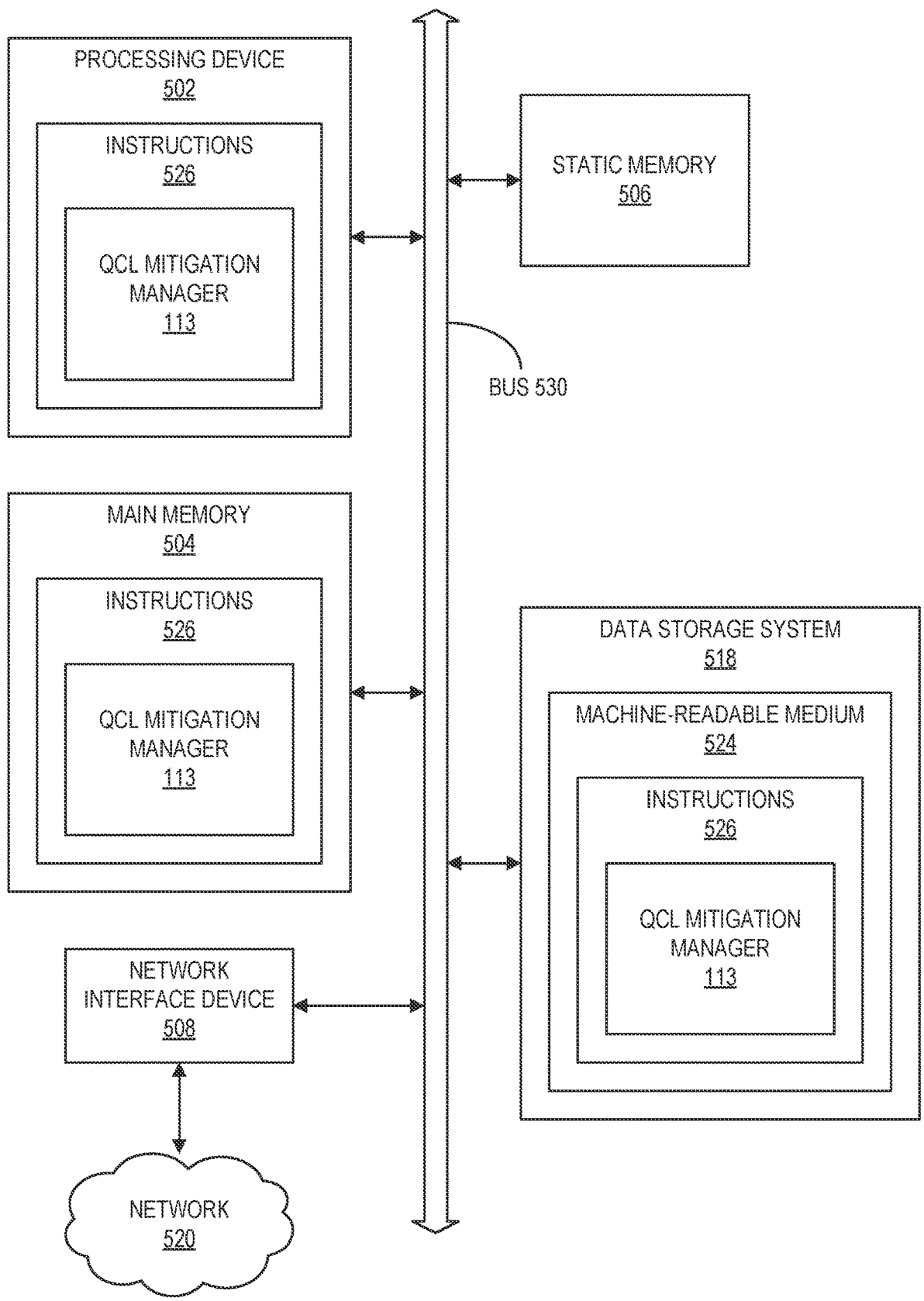
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the QCL mitigation manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a QCL mitigation manager (e.g., the QCL mitigation manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A method comprising:
   receiving, by a memory controller, a first set of data bits for programming a memory device;

writing, by the memory controller, a first subset of data bits of the first set of data bits to a first memory block of the memory device during a first pass of programming; and in response to determining that a threshold delay is satisfied, writing, by the memory controller, a second subset of data bits of the first set of data bits to the first memory block during a second pass of programming, the writing of the second subset of data bits including an increase in bit density of memory cells in the first memory block.

2. The method of claim 1, wherein determining that the threshold delay is satisfied comprises determining a difference between a first time of writing the first subset of data bits to a first wordline and a current time satisfies a threshold time difference.

3. The method of claim 1, wherein determining that the threshold delay is satisfied comprises determining a time difference is satisfied by measuring a difference between a first time stamp and a second time stamp, wherein measuring the difference comprises:
generating a first time stamp representing a write to a first wordline;
generating a second time stamp representing a write to a last wordline;
determining a time difference between the first time stamp and the second time stamp; and
comparing the time difference with the threshold delay.

4. The method of claim 1, further comprising:
determining that a time difference between a time of writing the first subset of data bits in a first pass of programming and a current time does not satisfy the threshold delay; and
writing the second subset of data bits of the first set of data bits to a buffer for at least the threshold delay less the time difference, wherein writing the second subset of data bits of the first set of data bits to a buffer is prior to determining that a threshold delay is satisfied.

5. The method of claim 1, wherein determining that the threshold delay is satisfied comprises determining that a threshold number of computing operations have been completed after writing a first subset of data bits of the first set to a first memory block of the memory device during a first pass of programming.

6. The method of claim 1 wherein the threshold delay is based on an electrical charge loss of the memory device.

7. The method of claim 6, further comprising increasing a programming voltage for each bit of the second subset of data bits based on the electrical charge loss of the memory device.

8. A non-transitory computer-readable storage medium comprising instructions that, when executed by a processing device, cause the processing device to:
receive a first set of data bits for programming to memory;
write a first subset of data bits of the first set of data bits to a first memory block of the memory during a first pass of programming; and
in response to determining that a threshold delay is satisfied, write a second subset of data bits of the first set of data bits to the first memory block during a second pass of programming, the writing of the second subset of data bits including an increase in bit density of memory cells in the first memory block.

9. The non-transitory computer-readable storage medium of claim 8, wherein to determine that the threshold delay is satisfied, the instructions further cause the processing device to determine a difference between a first time of writing the first subset of data bits to a first wordline and a second time of a current time satisfies a threshold time difference.

10. The non-transitory computer-readable storage medium of claim 8, wherein to determine that the threshold delay is satisfied, the instructions further cause the processing device to determine that a number of computing operations have been completed after writing a first subset of data bits of the first set to a first memory block of the memory during a first pass of programming satisfies a threshold number of computing operations.

11. The non-transitory computer-readable storage medium of claim 8, wherein to determine that the threshold delay is satisfied, the instructions further cause the processing device to:
determine a time difference is satisfied by measuring a difference between a first time stamp and a second time stamp, wherein measuring the difference further causes the processing device to:
generate a first time stamp representing a write to a first wordline;
generate a second time stamp representing a current time;
determine a time difference between the first time stamp and the second time stamp; and
compare the time difference with the threshold delay.

12. The non-transitory computer-readable storage medium of claim 8, the instructions further causing the processing device to:
determine that a time difference between a time stamp and a current time does not satisfy the threshold delay; and
write the second subset of data bits of the first set of data bits to a buffer for at least the threshold delay less the time difference, wherein writing the second subset of data bits of the first set of data bits to a buffer is prior to determining that a threshold delay is satisfied.

13. The non-transitory computer-readable storage medium of claim 8, wherein the threshold delay is based on an electrical charge loss of the memory.

14. The non-transitory computer-readable storage medium of claim 8, the instructions further causing the processing device to increase a programming voltage for each bit of the second subset of data bits based on an electrical charge loss of the memory.

15. A system comprising:
a memory device; and
a processing device, operatively coupled with a plurality of memory device to:
receive a first set of data bits for programming to memory;
write a first subset of data bits of the first set of data bits to a first memory block of the memory during a first pass of programming;
generate a first time stamp representing a start time of a write of the first subset of data bits;
generate a second time stamp representing a current system time;
determine a time difference between the first time stamp and the second time stamp; and
compare the time difference with a threshold delay;
in response to comparing the threshold delay, determining that the threshold delay is satisfied; and
writing a second subset of data bits of the first set of data bits to the first memory block during a second pass of programming, the writing of the second subset of data bits including an increase in bit density of memory cells in the first memory block.

16. The system of claim 15, the processing device further to:
- determine that a time difference between the first time stamp and the second time stamp does not satisfy the threshold delay; and
- write the second subset of data bits of the first set of data bits to a buffer for at least the threshold delay less the time difference, wherein writing the second subset of data bits of the first set of data bits to a buffer is prior to determining that a threshold delay is satisfied.

17. The system of claim 16, the processing device further to:
- receive a second set of data bits after writing the first subset of data bits and before writing the second subset of data bits;
- determining, after receiving the second set of data bits, that the time difference between the first time stamp and a current system time does not satisfy the threshold delay; and
- writing a third subset of data bits from the second set of data bits, wherein writing the third subset of data bits is prior to determining that a threshold delay is satisfied.

18. The system of claim 15, wherein the threshold delay is based on an electrical charge loss of the memory.

19. The system of claim 15, the processing device further to increase a programming voltage for each bit of the second subset of data bits based on an electrical charge loss of the memory.

20. The system of claim 15, the processing device further to determine that the threshold delay is satisfied comprises determining that a number of computing operations have been completed after writing a first subset of data bits of the first set to a first memory block of the memory during a first pass of programming satisfies the threshold delay.

* * * * *